US006947305B2

(12) United States Patent
Crowley

(10) Patent No.: US 6,947,305 B2
(45) Date of Patent: Sep. 20, 2005

(54) METHOD FOR FABRICATING AND IDENTIFYING INTEGRATED CIRCUITS AND SELF-IDENTIFYING INTEGRATED CIRCUITS

(75) Inventor: Matthew P. Crowley, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 210 days.

(21) Appl. No.: 10/636,036

(22) Filed: Aug. 6, 2003

(65) Prior Publication Data

US 2004/0029357 A1 Feb. 12, 2004

Related U.S. Application Data

(62) Division of application No. 10/068,195, filed on Feb. 4, 2002, now Pat. No. 6,649,505.

(51) Int. Cl.$^7$ .............................................. G11C 5/06
(52) U.S. Cl. .................................... 365/63; 365/189.02
(58) Field of Search ............................... 365/63, 189.02

(56) References Cited

U.S. PATENT DOCUMENTS

| | | | |
|---|---|---|---|
| 4,646,266 A | | 2/1987 | Ovshinsky et al. |
| 5,745,407 A | | 4/1998 | Levy et al. |
| 5,835,396 A | | 11/1998 | Zhang |
| 6,034,882 A | | 3/2000 | Johnson et al. |
| 6,185,122 B1 | | 2/2001 | Johnson et al. |
| 6,208,545 B1 | * | 3/2001 | Leedy .......................... 365/51 |
| 6,236,587 B1 | | 5/2001 | Gudesen et al. |

FOREIGN PATENT DOCUMENTS

WO    WO 99/14763    3/1999

OTHER PUBLICATIONS

"Exotic memories, diverse approaches," EDN Asia, Sep. 2001, pp. 22–33.
MAPLD 99, "Laser–formed Vertical Metallic Link and Potential Implementation in Digital Logic Integration," Zhang et al., 19 pages (1999).
Search History for U.S. Appl. No. 10/068,195, 2 pages (May 12, 2003).

* cited by examiner

Primary Examiner—Anh Phung
Assistant Examiner—Pho M. Luu
(74) Attorney, Agent, or Firm—Brinks Hofer Gilson & Lione

(57) ABSTRACT

Two types of topologically different three-dimensional integrated circuits (for example a 4-layer three-dimensional memory array and an 8-layer three-dimensional memory array) are fabricated from a single set of photo-lithographic masks. In one example, masks 1–5 are used along with other masks to create the first four levels of memory cells in both a 4-layer memory array and an 8-layer memory array. The 8-layer memory array is completed with masks used to form the top four layers of the array. An integrated circuit identification circuit generates an appropriate circuit identification signal for both types of integrated circuits by sensing whether a conductive path across some or all of the device levels of the integrated circuit is continuous, and then by selecting the appropriate circuit identification signal.

9 Claims, 10 Drawing Sheets

| X3P | X5P | X7P | X9P | S1 | S0 |
|-----|-----|-----|-----|----|----|
| 1 | 0 | 0 | 0 | 0 | 0 |
| X | 1 | 0 | 0 | 0 | 1 |
| X | X | 1 | 0 | 1 | 0 |
| X | X | X | 1 | 1 | 1 |

METHOD FOR FABRICATING AND IDENTIFYING INTEGRATED CIRCUITS AND SELF-IDENTIFYING INTEGRATED CIRCUITS

This application is a divisional of U.S. application Ser. No. 10/068,195 filed Feb. 4, 2002 now U.S. Pat. No. 6,649,505, which is hereby incorporated by reference herein.

BACKGROUND

This invention relates to methods for fabricating integrated circuits, and to the resulting circuits.

Three-dimensional integrated circuits include multiple stacked layers of electrical or optical devices, all supported by a single underlying substrate. Such a three-dimensional arrangement substantially increases the device density of the integrated circuit.

Many such three-dimensional integrated circuits are fabricated with a greater or lesser number of stacked layers, depending upon the number of devices required in the final integrated circuit. For example, a 64 MB memory array may be made of 8 stacked layers of memory cells, while a 32 MB memory array may be made up of 4 stacked layers of memory cells.

A need presently exists for methods for enhancing the flexibility with which such three-dimensional integrated circuits can be fabricated and for reducing the cost of such integrated circuits.

SUMMARY

By way of general introduction, the preferred embodiments described below allow two or more topologically different integrated circuits to be formed using the same set of photolithographic masks for the lower device layers. First integrated circuits include a larger number of vertically stacked layers of devices and employ the full set of masks, and second integrated circuits have a smaller number of vertically stacked layers of devices and use a subset of the full set of masks. Because the same masks are used to fabricate the lower device layers of both the first and second integrated circuits, fabrication is made substantially more flexible and costs are reduced.

The preferred embodiments described below include at least one voltage source on a top layer of the integrated circuit, at least one sensing contact on one of the lower layers of the integrated circuit, and at least one conductive path. Each conductive path extends between the respective voltage source and sensing contact for integrated circuits having a respective set of device layers, but the conductive path does not provide continuity between the respective voltage source and sensing contact for other integrated circuits lacking some or all of the respective set of layers. A switch such as a multiplexer is controlled as a function of the voltage on each sensing contact such that the switch selects a circuit identification signal from a first set when the sensed signal on the sensing contact is in a first range of values, and a circuit identification signal from a second set when the sensed signal on the sensing contact is in a second range of values. In this way, the switch supplies the appropriate circuit identification signal as an output signal, without requiring different masks for the fabrication of the first and second integrated circuits. Multiple sensing contacts can be used to switch among three or more circuit identification signals, as described below.

The foregoing paragraphs have been provided by way of general introduction, and they are not intended to narrow the scope of the following claims.

DETAILED DESCRIPTION OF THE DRAWINGS

Figure 1:
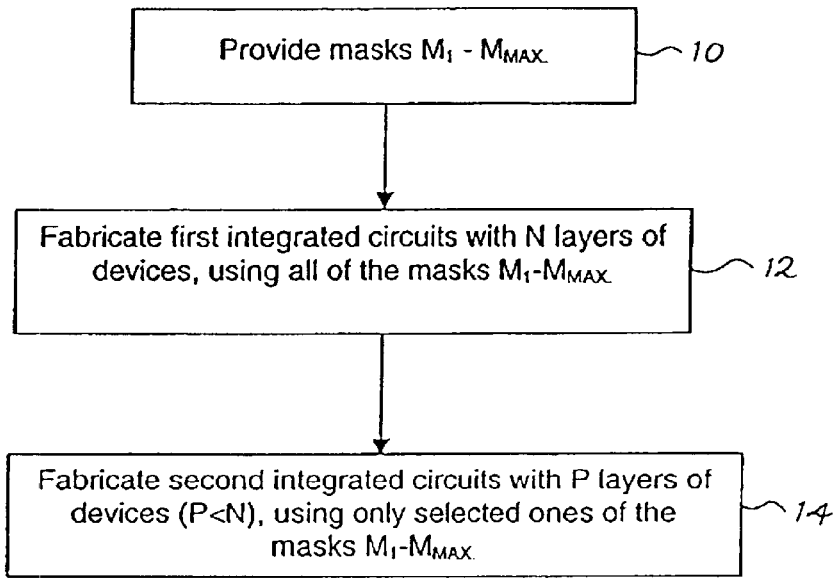
FIG. 1 is a block diagram of a method for fabricating first and second integrated circuits.
Figure 3:
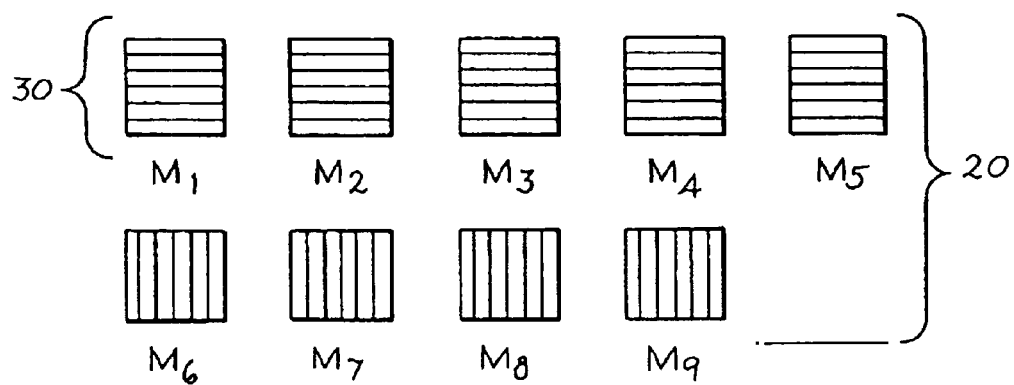
FIG. 3 is a schematic diagram of first and second sets of photolithographic masks useful in the methods of FIGS. 1 and 2.

FIG. 1 provides a flowchart of a method for fabricating two topologically different integrated circuits using photolithographic masks. In block 10, a first set of masks $M_1$–$M_{MAX}$ is provided. By way of example, the first set 20 of masks may include masks $M_1$–$M_9$ as shown in FIG. 3. Each of the masks of the first set 20 is used to project a respective desired pattern onto the uppermost surface of an integrated circuit during fabrication. The term "photolithographic mask" is intended broadly here, and such masks can be used with the widest variety of integrated circuit fabrication techniques. For example, photolithographic masks can be used with visible, ultraviolet, extreme ultraviolet, or x-ray radiation, and photolithographic masks may also be adapted for use with other types of beams, including electron beams. In the example of FIG. 3, the masks $M_1$, $M_3$, $M_5$, $M_7$, $M_9$ include linear elements arranged parallel to a first direction (the X direction). These linear elements are well suited to the fabrication of word lines in a memory array, i.e. conductors arranged parallel to one another and extending along the X direction. The masks $M_2$, $M_4$, $M_6$, $M_8$ include linear elements running along a Y direction oriented orthogonally to the X direction. These masks $M_2$, $M_4$, $M_6$, $M_8$ are adapted for the fabrication of bit lines extending orthogonally to the word lines formed with the masks $M_1$, $M_3$, $M_5$, $M_7$ and $M_9$. Additionally, the masks $M_1$–$M_{MAX}$ include features for forming the conductive path described below in conjunction with FIGS. 6–18. Typically, many other masks are included in $M_1$–$M_{MAX}$, in addition to $M_1$–$M_9$ shown in FIG. 3, including the masks used to form vertical connections, to pattern the top metal layer, and to form other features of integrated circuits. The set of masks $M_1$–$M_{MAX}$ can include any appropriate combination of masks useful in fabricating the integrated circuit of interest.

Returning to FIG. 1, in block 12 first integrated circuits are formed, each with N layers of devices, using all of the masks $M_1$–$M_{MAX}$ of the first set 20. The N layers are vertically stacked one above the other such that each first integrated circuit is a three-dimensional circuit, and the devices formed in the layers may vary widely. In one example described in greater detail below, each first integrated circuit is a three-dimensional memory, and the devices are memory cells. However, this invention is not limited to use with memory arrays, and a wide variety of electrical, optical, and photonic devices can be included in the respective layers. For example, the first integrated circuits can comprise programmable gate arrays.

In block 14 second integrated circuits are formed with P layers of devices (where P<N) using selected ones of the masks $M_1$–$M_{MAX}$ of the first set 20. In one non-limiting example, the masks $M_1$–$M_5$ of FIG. 3 are included in a second set 30 of masks. All of the masks used to fabricate the second integrated circuits in block 14 are included in the first set 20 of block 12. With this approach, a single full set of masks includes all the masks required both for fabricating the first integrated circuits (having a larger number of vertically stacked layers) in block 12 and for fabricating the second integrated circuits (having a smaller number of vertically stacked layers) in the second block 14.

Figure 2:
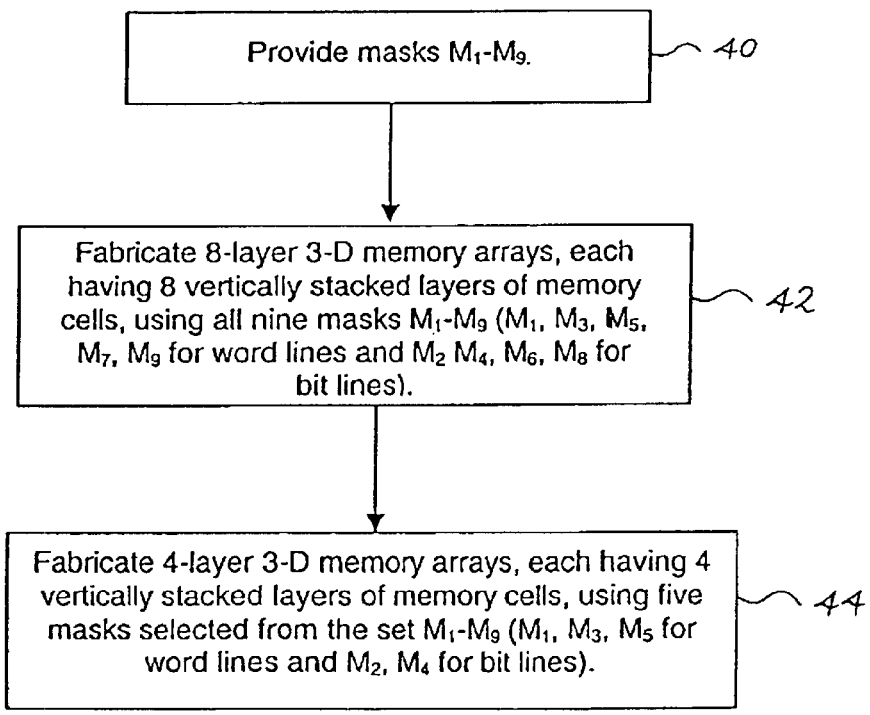
FIG. 2 is a block diagram of a method for fabricating first and second three-dimensional memory arrays.
Figure 4:
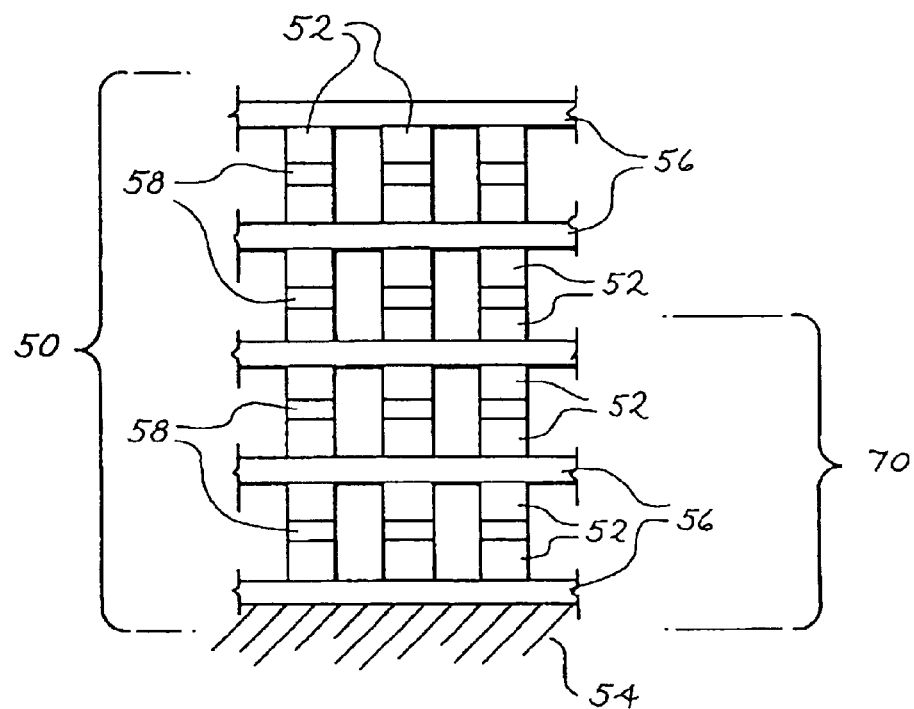
FIG. 4 is a fragmentary schematic diagram of an 8-level memory array.
Figure 5:
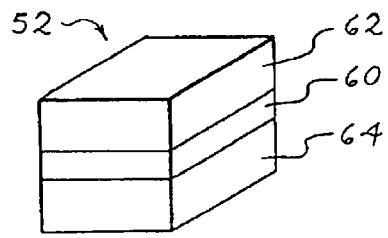
FIG. 5 is a schematic diagram of a memory cell included in the memory array of FIG. 4.

FIG. 2 provides a block diagram of one non-limiting example of the method of FIG. 1 that will be discussed in greater detail in conjunction with the following drawings. In the method of FIG. 2, the masks provided in block 40 include the masks $M_1$–$M_9$ of FIG. 3 and the additional masks described above. In block 42, 8-layer three-dimensional memory arrays are fabricated, each having 8 vertically stacked layers of memory cells, using all nine of the masks $M_1$–$M_9$. The masks $M_1$, $M_3$, $M_5$, $M_7$, $M_9$ are used to form word lines, and the masks $M_2$, $M_4$, $M_6$, $M_8$ are used to form bit lines. By way of a non-limiting example, the memory array 50 of FIG. 4 includes 8 layers of memory cells 52 vertically stacked above a substrate 54. Each memory cell 52 is positioned between a respective word line 56 and a respective bit line 58. As shown in FIG. 4, the word lines 56 are oriented orthogonally to the bit lines 58. In this non-limiting example, each memory cell 52 can include an anti-fuse layer 60 and two diode components 62, 64 on opposed sides of the anti-fuse layer 60 (FIG. 5). The diode components 62, 64 are semiconductor elements formed with opposite polarity doping. The memory cell of FIG. 5 forms a write-once memory cell in which the forward-biased current across the memory cell 52 varies as a function of whether the anti-fuse layer 60 is intact or not. Of course, this invention is not limited to use with memory cells of the type shown in FIG. 5, and a wide variety of memory cells can be used, including re-writeable cells, and write-once memory cells having different geometries. By way of non-limiting example, any of the memory cells described in the following U.S. patents and patent applications (all assigned to the assignee of the present invention and hereby incorporated by reference) can be used: U.S. Pat. Nos. 6,034,882 and 6,185, 122, and U.S. patent application Ser. Nos. 09/927,648, 09/560,626 and 09/814,727.

Returning to FIG. 2, in block 44, 4-layer three-dimensional memory arrays are fabricated, each having four vertically stacked layers of memory cells, using a set of masks including photolithographic masks $M_1$–$M_5$. These are the same masks $M_1$–$M_5$ as the masks $M_1$–$M_5$ used in block 42. In this case, masks $M_1$, $M_3$ and $M_5$ form word lines, and masks $M_2$, $M_4$ form bit lines. FIG. 4 shows that the resulting memory array 70 includes the bottom-four layers of memory cells 52 of the 8-layer memory 50 described above in conjunction with block 42. Of course, the 4-layer memory array 70 does not include the upper four layers of the memory 50 (because the masks $M_6$–$M_9$ are not used).

In the example of FIG. 2, a single mask is used both to form the word lines or bit lines of a given level and to form the corresponding edges of underlying memory cells. This reduces the total number of required masks. Such self-alignment features are discussed in detail in the U.S. patents and patent applications identified above. This is not a requirement of the present invention, and two or more masks can be used to form any given level of devices. Thus, an N-level array of electrical, optical or photonic devices may require the use of more than N+1 masks.

Since all of the masks used to form the 4-layer memory array 70 of block 44 are included in the masks used to form the 8-layer memory array 50 of block 42, integrated circuits with several different device densities can be built using a single mask set. This allows short notice substitution of one device density for another based on customer orders or other considerations. Reduced circuit design, layout and fab resources are required to produce several different device density circuits. This represents a substantial improvement over prior-art approaches, in which different mask sets are used or expensive multiple-chip packages are assembled in order to create integrated circuits of differing device density.

In the methods of FIGS. 1 and 2, the final device density of the integrated circuit is controlled by including or excluding masks of the first mask set, not by running entirely different masks sets in the fab. As explained above, an on-the-fly decision can be made (even after masks $M_1$–$M_5$ have be used to create the first four levels of the array 70) to build, for example, a 4 level, 6-level or 8-level memory array. No additional masks are needed to make the smaller memory array (once the masks are created for the larger memory array, and the circuits at each level are laid out such that they are generalized for N device levels). Only the deletion of masking levels from the manufacturing flow is required to obtain the desired device density. The decision can be made upon wafer start to truncate manufacturing after a desired memory level In the foregoing example, the memory array 70 has $2^2$ levels and the memory array 50 has $2^3$ levels. In general, circuit design is often simplified when each integrated circuit has $2^i$ levels. For example, when a memory array does not have $2^i$ levels, it will not contain a power of two number of bits or bytes. This presents a complication in the calculation of starting address for individual memory arrays. This is not a requirement in all cases, and in general, the number of layers in the second integrated circuit may be any desired subset of the layers in the first integrated circuit.

Also, in the example of FIG. 4 the memory array 70 is formed by truncating the sequence of masks. This is also only a non-limiting example, and not a requirement for this invention. For example, the second integrated circuits of FIG. 1 can be fabricated using all of the masks of the full set used in block 12, except for selected masks deleted from any desired portion of the mask sequence. For example, the masks used for the second integrated circuits of block 14 can include the first, second, fifth and eighth masks of an 8-mask set.

In order to allow this flexibility, the masks are preferably designed such that not building selected levels of the larger integrated circuit does not interrupt any vertical interconnection schemes between layers.

In the examples described above, all of the photolithographic masks used in forming the second integrated circuits are also used in forming the first integrated circuits. This is not a requirement for all embodiments of the present invention. For example, the second integrated circuits may use a different mask for patterning the uppermost vias than that used for the first integrated circuits. In general, the same photolithographic masks are used to form at least the initial device layers of both the first and second integrated circuits. In this way, substantial flexibility in fabrication is retained in that at least the initial mask and patterning operations are identical for both the first and second integrated circuits. At some point in the integrated circuit fabrication process, a decision is made as to whether the integrated circuits being fabricated will be of the first or second type. After this point, the integrated circuits are finished with the appropriate set of masks for the selected topology. For example, the same masks can be used for device layers $L_1, L_2, \ldots L_{M-1}$, for both first and second integrated circuits. When the integrated circuits are to be of the first type, additional masks are used to complete all N vertically stacked device layers. When the integrated circuits being fabricated are of the second type, other photolithographic masks can be used to complete the device layer M and the integrated circuit.

File systems that access memory generally receive an identification signal from the memory which communicates the capacity of the memory. This identification signal is usually hard-wired in top metal on the memory. This common approach requires multiple top metal masks, one for each memory size. Because all of the masks used in forming the memory array 70 of FIG. 4 are also used in forming the memory array 50 of FIG. 4, this prior-art approach is sub-optimal. As described below, steps are preferably taken to insure that both of the memory arrays 50, 70 generate appropriate, different, respective circuit identification signals without multiple top metal masks. These circuit identification signals identify the integrated circuits to a processor, and in particular identify the size of the respective memory arrays. FIGS. 6–18 relate to one method for generating such circuit identification signals.

Figure 6:
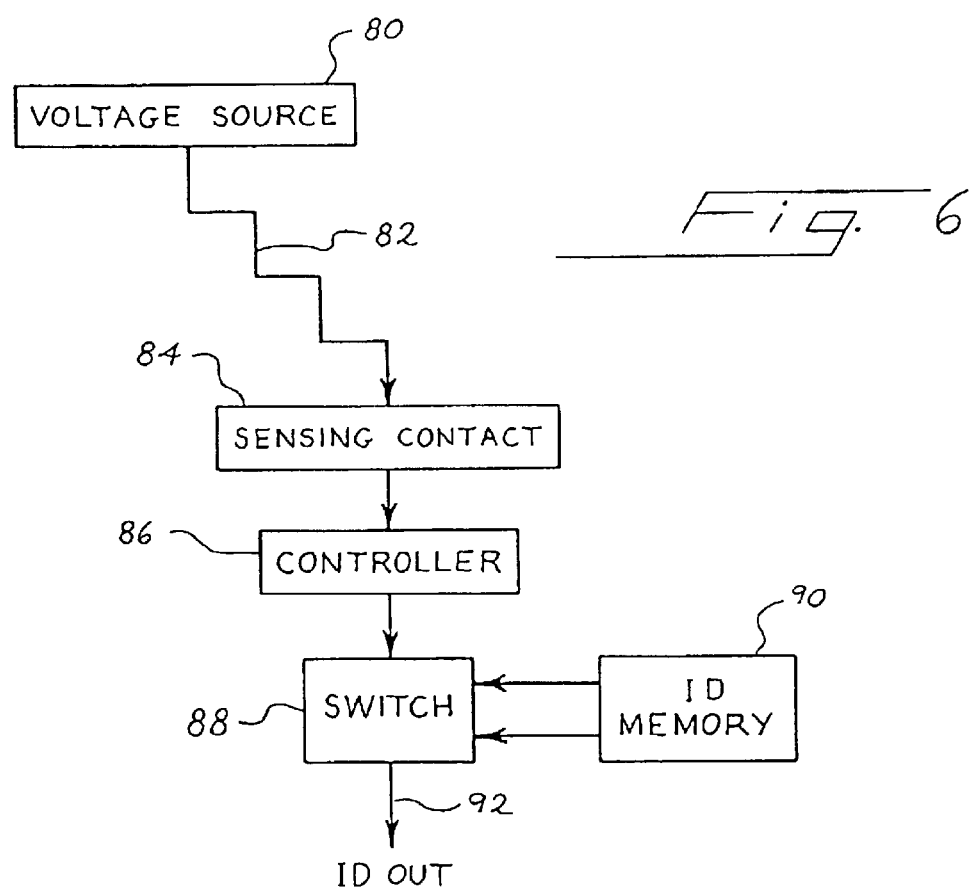
FIG. 6 is a block diagram of a memory identification circuit.

By way of general overview, FIG. 6 shows a block diagram of a system included in both of the arrays 50, 70. This system includes a voltage source 80 that is connected to a conductive path 82. For at least some integrated circuits, the conductive path 82 terminates in a sensing contact 84, and the conductive path 82 crosses multiple device levels of the array. As will be explained in greater detail below, the conductive path 82 provides an electrical connection between the voltage source 80 and the sensing contact 84 for arrays having a full set of 8 layers memory cells (in this non-limiting example), but the conductive path 82 does not provide electrical contact between the voltage source 80 and the sensing contact 84 for arrays having fewer than the full number of device layers.

The sensing contact 84 delivers a sensed signal to a controller 86 that controls a switch or latch 88 such as a multiplexer as a function of the voltage of the sensed signal on the sensing contact 84. The switch 88 is coupled to a memory 90 that stores two circuit identification numbers. Depending upon the voltage of the sensed signal supplied to the controller 86, this controller 86 commands the switch 88 to transmit the appropriate one of the two stored identification signals as an output identification signal 92. Thus, when the voltage source 80 is connected with the sensing contact 84 by the conductive path 82, the sensed signal applied to the controller 86 is in a first state, and a first one of the circuit identification signals of the memory 90 is supplied as the output identification signal 92. Conversely, when the conductive path 82 does not electrically interconnect the voltage source 80 with the sensing contact 84, the controller 86 commands the switch 88 to supply the second circuit identification signal from memory 90 as the output identification signal 92. The controller 86 discriminates between the condition in which the sensed signal on the sensing contact is in a first range of values (closer to the voltage of the voltage source 80) and a second range of values (farther from the voltage of the voltage source 80) to discriminate between a continuous conductive path 82 and a discontinuous conductive path 82.

The controller 86 of this example responds to the voltage of the sensed signal. In this context, voltage should be taken as one non-limiting example of a suitable parameter. The sensed signal from the sensing contact 84 may be another parameter such as resistance or current, and the voltage source 80 may be replaced by a current source, a current sink or any other suitable reference.

Figure 7:
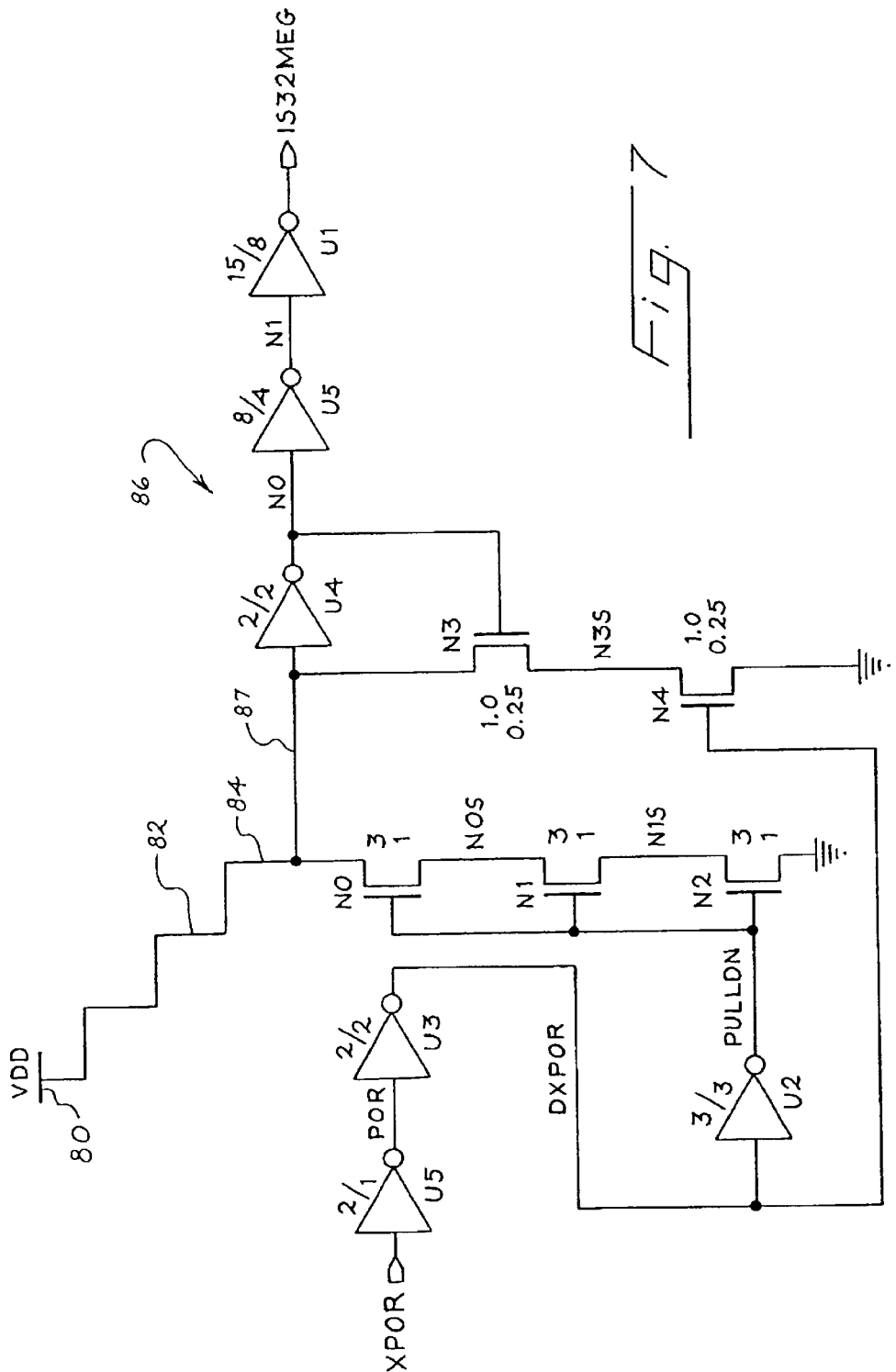
FIG. 7 is a schematic diagram of the controller of FIG. 6.

FIG. 7 provides a schematic diagram of one non-limiting example of the voltage source 80, the conductive path 82, the sensing contact 84, and the controller 86. Note that the conductive path 82 transverses in this example multiple device levels between the voltage source 80 at the voltage VDD (situated above the upper level of memory cells) and the sensing contact 84 (positioned below the lowermost level of memory cells). The lead 87 is preferably kept short to reduce capacitance.

Figure 8:
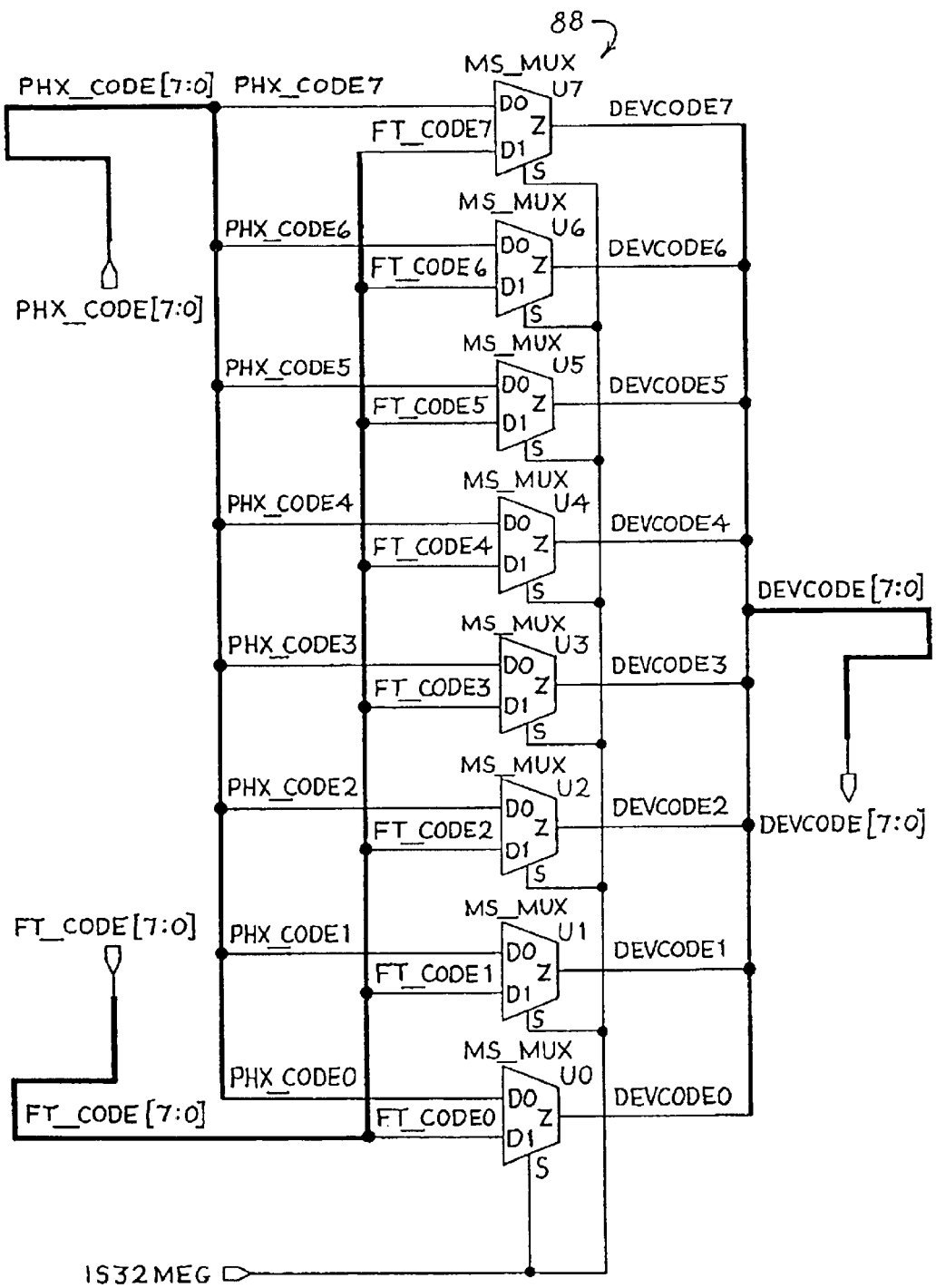
FIG. 8 is a schematic diagram of the switch of FIG. 6.

FIG. 8 provides a schematic diagram of the switch 88 which in this case is implemented as an 8-bit multiplexer. Simply by way of one non-limiting example, the circuit identification signal for a 32 MB array 70 may be hex 75, and the circuit identification signal for a 64 MB array 50 may be hex 76.

Figure 9:
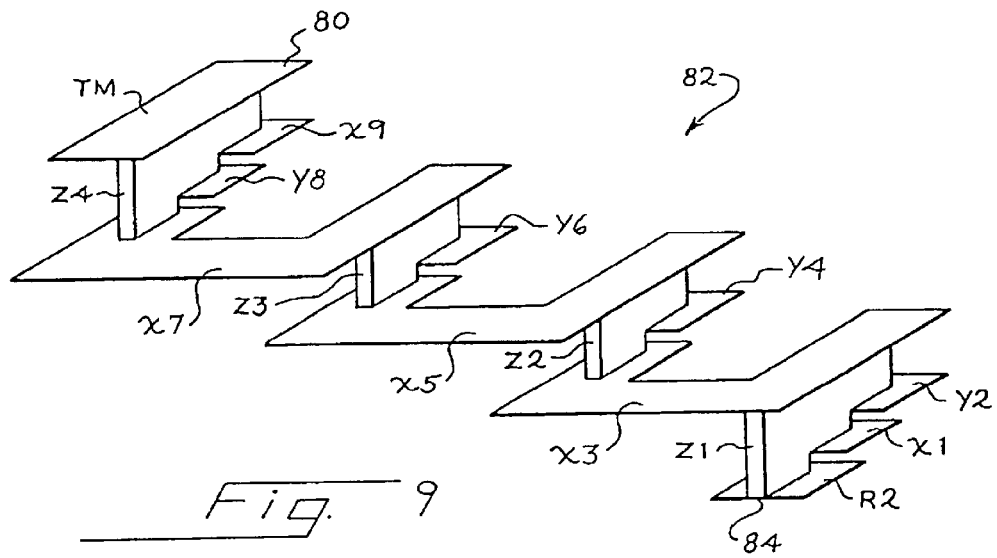
FIGS. 9 and 10 are schematic isometric diagrams of the voltage source, conductive path, and sensing contact of an 8-layer memory array and a 4-layer memory array, respectively.
Figure 11:
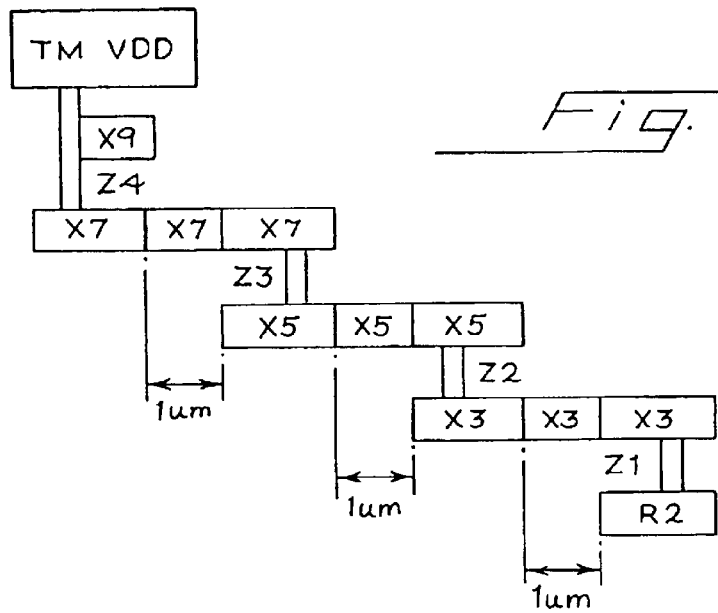
FIGS. 11 and 12 are schematic side and top views, respectively, of the structure of FIG. 9.
Figure 12:
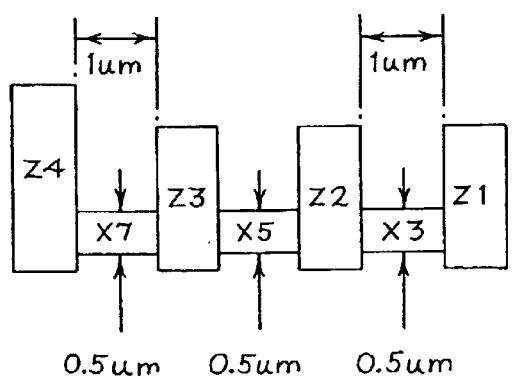

FIG. 9 provides a schematic isometric view of the conductive path 82 as fully formed in an 8-level memory array 50. In this example, intervening layers such as layers defining memory cells and surrounding insulation regions are not shown, and the voltage source 80 is formed by the top metal layer TM of the array. Conductors laid down with the word lines are denominated X1, X3, X5, X7 and X9, and conductors laid down with the bit lines are denominated Y2, Y4, Y6, Y8. The sensing contact 84 in this example is implemented on a routing layer R2 formed of a conductor such as tungsten silicide. Conductive stepped vias (referred to as zias in this specification) are identified as Z1, Z2, Z3 and Z4. Note that the conductor X7 provides a lateral bridge between the zia Z4 and the zia Z3. Similarly, the conductor X5 provides a lateral bridge between the zia Z3 and the zia Z2 and the conductor X3 provides a lateral bridge between the zia Z2 and the zia Z1. FIGS. 11 and 12 provide side and top views, respectively, of the conductive path of FIG. 9, showing preferred dimensions.

Figure 13:
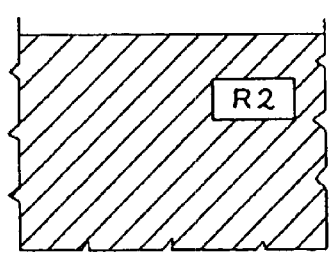
FIGS. 13–17 are side views of five successive stages in the fabrication of the zia Z1 of FIGS. 9, 10, 11 and 12.
Figure 14:
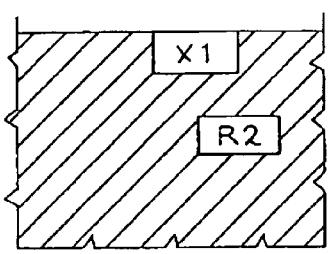
Figure 15:
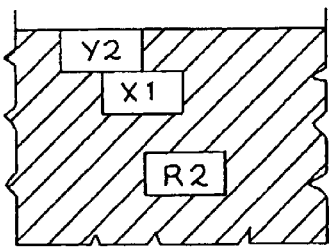
Figure 16:
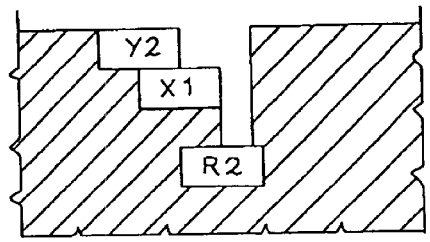
Figure 17:
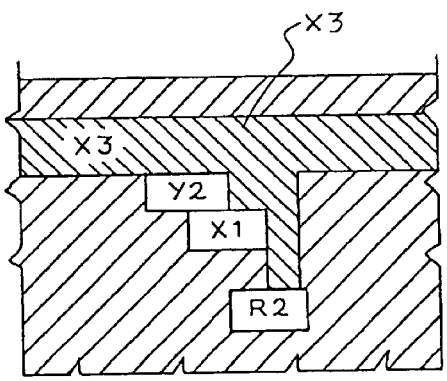

The zias Z1, Z2, Z3, Z4 may be formed using the techniques shown schematically in the side views of FIGS. 13–17. These figures relate to the formation of the zia Z1, but similar approaches can be used for the other zias. In FIG. 13 the routing layer R2 is formed in an insulator such as SiO₂. Then, as shown in FIG. 14, the conductor X1 and associated insulator are deposited. As shown in FIG. 15, the conductor Y2 and associated insulator are deposited. Next, as shown in FIG. 16, a hole that is shaped as appropriate for the zia Z1 is etched in the insulator. As shown in FIG. 17, the conductor X3 is formed, which simultaneously creates the conductor X3 and the conductor that forms the zia Z1.

In the 8-level memory array 50 of FIG. 4, all of the conductors X1–X9 and Y2–Y8 and all of the zias Z1–Z4 are present, and the conductive path 82 forms an electrical connection extending in an uninterrupted fashion between the voltage source 80 and the sensing contact 84. As explained above, this causes the controller 86 of FIG. 6 to cause the switch 88 to select the first circuit identification signal for output.

Figure 10:
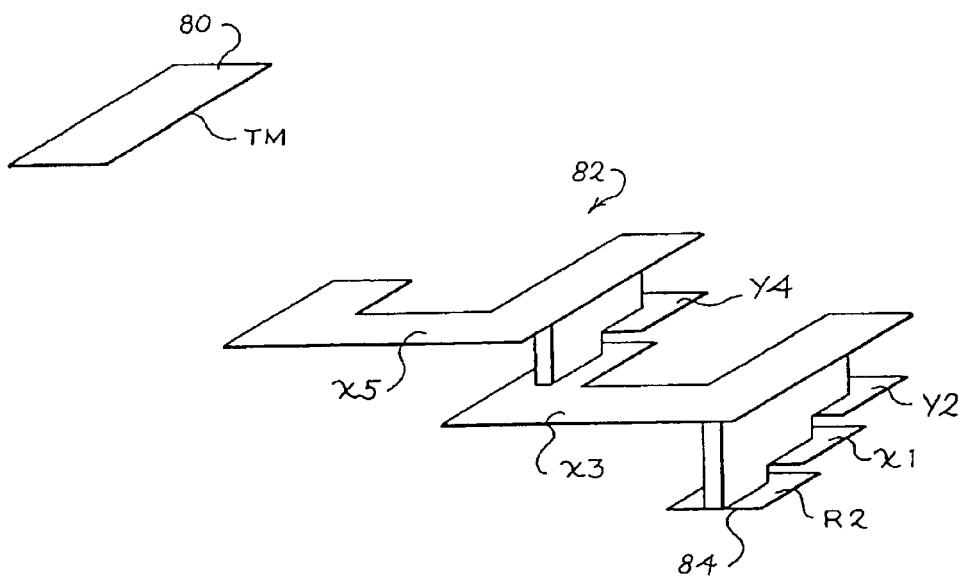

FIG. 10 shows the conductive path 82 as it exists for the 4-level memory array 70 of FIG. 4. As explained above, the memory array 70 includes only the layers associated with the masks $M_1$–$M_5$, and the layers associated with the masks $M_6$–$M_9$ are not formed. For this reason, the conductors Y6, X7, Y8, X9 and the zia Z3 is not formed. The resulting conductive path 82 is discontinuous, and there is no electrical interconnection between the voltage source 80 and the sensing contact 84. As explained above, under these circumstances the switch 88 is controlled to select the second circuit identification signal for output.

Figure 18:
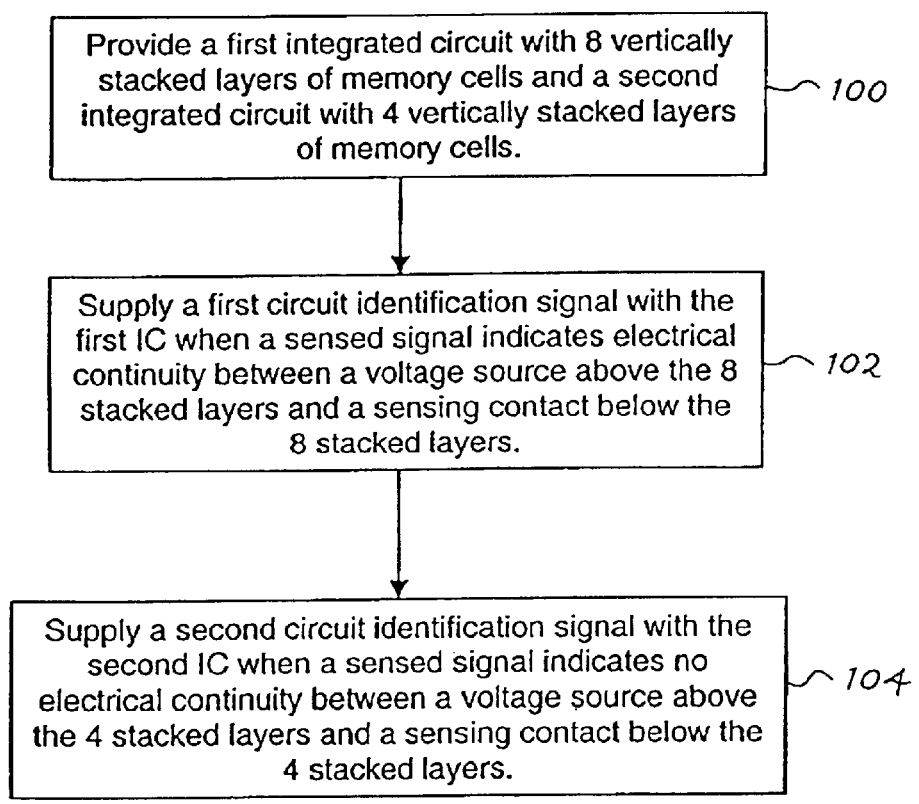
FIG. 18 is a block diagram of a method for supplying circuit identification signals.

FIG. 18 provides a block diagram of a method for identifying an integrated circuit that uses the techniques described above. In block 100, a first integrated circuit is provided with 8 vertically stacked layers of memory cells, and a second integrated circuit is provided with 4 vertically stacked layers of memory cells.

In block 102, a first circuit identification signal is supplied with the first integrated circuit when a sensed signal indicates electrical continuity between a voltage source above the 8 stacked layers of memory cells and a sensing contact below the 8 stacked layers of memory cells.

In block 104, a second identification signal is supplied with the second integrated circuit when a sensed signal indicates no electrical continuity between a voltage source above the 4 stacked layers of memory cells and a sensing contact below the 4 stacked layers of memory cells.

In the foregoing example, only a single conduction path was used to discriminate between only two types of integrated circuits. More generally speaking, the techniques described above can be used to create integrated circuits that automatically provide the appropriate circuit identification signal selected among three or more alternatives.

Figure 19:
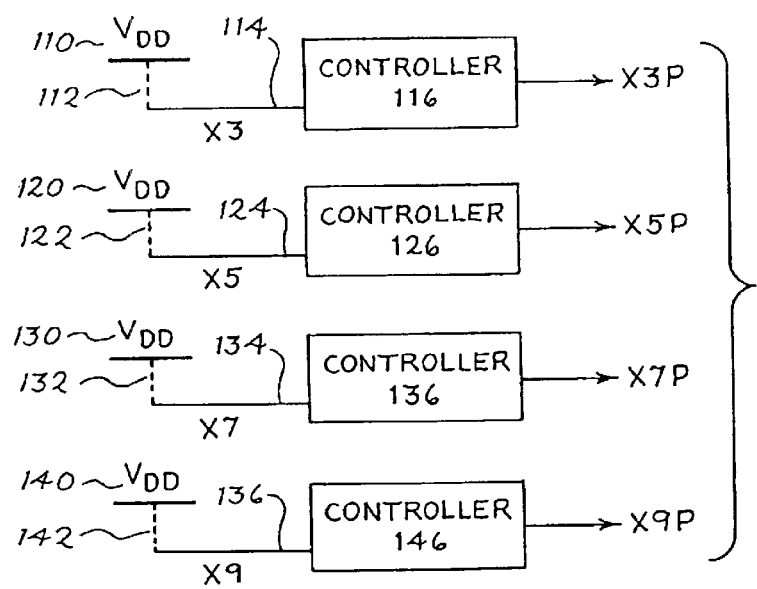
FIG. 19 is a block diagram of part of another memory identification circuit.

For example, FIG. 19 provides a schematic diagram of a portion of an integrated circuit that includes four conductive paths 112, 122, 132, 142, each associated with a respective voltage source 110, 120, 130, 140 and a respective sensing contact 114, 124, 134, 144. In this example, the voltage sources 110, 120, 130, 140 are all positioned at the top layer of the integrated circuit. The sensing contacts 114, 124, 134, 144 are all positioned adjacent to substrate, and the conductive paths 112, 122, 132, 142 are arranged to provide electrical continuity between the respective voltage source and sensing contact when the respective device layer is present and to provide no continuity between the respective voltage source and the respective sensing contact when the respective device layer is absent.

By way of example, the conductive paths 112, 122, 132, 142 can be arranged to provide a continuous electrical path between the respective voltage source and sensing contact only when the word lines X3, X5, X7 and X9 are present, respectively. When the X3 word line is present in this example, the associated memory array contains at least 16 MB. Similarly, when the X5, X7 and X9 word lines are present, the associated memory array has at least 32, 48, and 64 MB; respectively.

As shown in FIG. 19, the sensing contacts 114, 124, 134, 144 provide input signals to respective controllers 116, 126, 136, 146. These controllers may be identical to the controller 86 described above. Each controller generates a respective output signal X3P, X5P, X7P, X9P which is in the logic 1 state when the associated word line is present and in the logic 0 state otherwise.

Figures 20, 21:
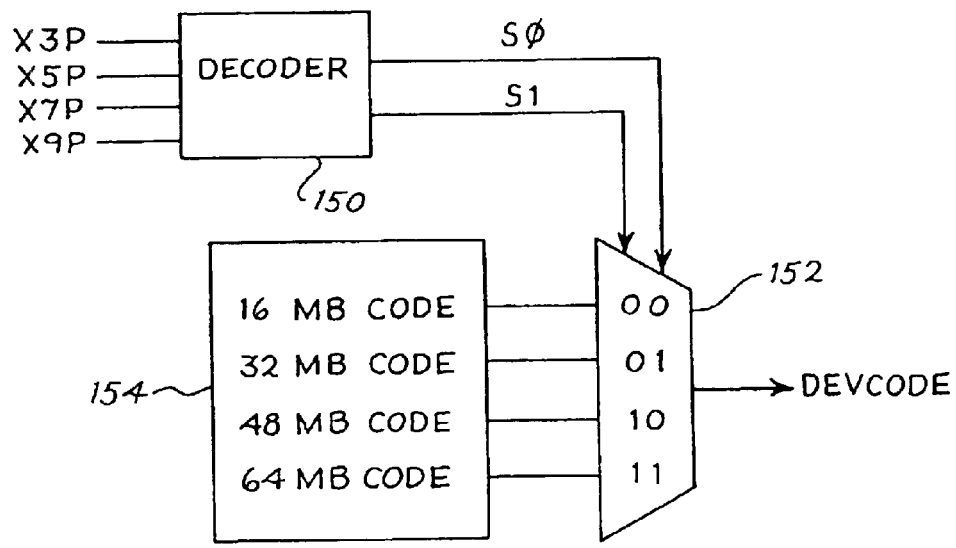
FIG. 20 is a block diagram of a decoder and multiplexer used in conjunction with the circuit of FIG. 19.
FIG. 21 is a table illustrating operation of the decoder of FIG. 20.

As shown in FIG. 20, the signals generated by the controllers 116, 126, 136, 146 of FIG. 19 are applied to a decoder 150 which in turn generates switch control signals S0, S1. The switch control signals S0, S1 control a multiplexer 152, and the multiplexer 152 is connected to an ID memory 154. In this example, the ID memory 154 stores four circuit identification signals as appropriate for 16, 32, 48 and 64 MB memory arrays. The multiplexer 152 selects the appropriate one of the stored circuit identification signals from the memory 154 in response to the switch control signals S0, S1, and the multiplexer 152 supplies the selected circuit identification signal as an output.

FIG. 21 provides an example of the decoding operation performed by the decoder 150. In FIG. 21, the symbol "X" is used to indicate that the logical state of the respective input does not affect the output. The decoder 150 may be implemented as a recorded table, or alternatively as a logical operation. For example, the switch control signal S1 may be generated from the illustrated input signals according to the following equation:

$$S1 = X7P \cdot \overline{X9P} + X9P = X7P + X9P \qquad (\text{Eq. 1})$$

Similarly, the switch control signal S0 can be generated according to the following equation:

$$S0 = X5P \cdot \overline{X7P} \cdot \overline{X9P} + X9P = X9P + X5P \cdot \overline{X7P} \qquad (\text{Eq. 2})$$

Though the circuit identification system of FIGS. 19–21 is more complicated than that of FIGS. 6–18 (in that it generates one of four appropriate circuit identification signals rather than one of two), the two systems are quite similar in general principles of operation. The presence or absence of a continuous electrical connection between each of the voltage sources 110, 120, 130, 140 and the respective sensing contact 114, 124, 134, 144 determines whether the selected circuit identification signal is chosen from a first set or a second set. For example, when the conductive path 142 is continuous (and the X9 word line is present) the X9P signal is in the logic 1 state and the selected circuit identification signal is the 64 MB device code. When the conductive path 142 is discontinuous, the X9 word line is absent, the signal X9P is in the logic 0 state, and the selected circuit identification signal is chosen from the set consisting of three circuit identification signals (the 16, 48 and 64 MB codes) depending upon the state of the other inputs to the decoder 150.

Of course, many changes and modifications can be made to the preferred embodiments described above. For example, the voltage of the voltage source 80 can be any desired voltage, including ground. This invention can be adapted for use with integrated circuits other than memory arrays, and when adapted for use with memory arrays the memory arrays can include any desired number of levels of devices. Individual memory cells can be fabricated using any suitable technology, and this invention is not limited to the specific examples given above. Also, the conductive paths may not include conductors formed with all of the masks of the respective integrated circuit. For example, when no Y2 connection is needed in an X decode circuit, the zia Z1 can omit Y2 and thereby reduce the size of the cell. When a Y2 connection is needed (e.g., in a Y decode circuit), the zia Z1 will include Y2 and use a larger cell.

As another alternative, the conductive path does not have to be arranged in a horizontally extending path as shown in FIG. 9. Instead, the conductive path may be vertically stacked.

As used herein, the term "set" is intended broadly to mean one or more.

The foregoing detailed description has discussed only a few of the many forms that this invention can take. For this reason, this detailed description is intended only by way of illustration, and not by way of limitation. It is only the following claims, including all equivalents, that are intended to define the scope of this invention.

What is claimed is:

1. A method for identifying a circuit, said method comprising:
    (a) providing a plurality of integrated circuits, each integrated circuit comprising a plurality of vertically stacked device layers, a source, a sensing contact, and a conductive path extending across at least some of the stacked device layers, said integrated circuits comprising first ones of the integrated circuits, in which the conductive path interconnects the respective sensing contact and source, and second ones of the integrated circuits, in which the conductive path does not interconnect the respective sensing contact and source;
    (b) supplying circuit identification signals selected from a first set with the first integrated circuits in response to sensed signals on the respective sensing contacts within a first range of values; and
    (c) supplying circuit identification signals selected from a second set with the second integrated circuits in response to sensed signals on the respective sensing contacts within a second range of values.

2. The method of claim 1 wherein the source is characterized by a source value, and wherein the source value is closer to the first range values than to the second layer of values.

3. The method of claim 1 wherein the source and the sensing contact are disposed on different ones of the stacked device layers.

4. The method of claim 1 wherein the source comprises a voltage source, wherein the sensed signal comprises a voltage signal, and wherein the first and second ranges of values are respective ranges of voltages.

5. A self-identifying circuit comprising:
    an integrated circuit comprising a plurality of vertically stacked device layers, a source, a sensing contact, and a conductive path coupled with the sensing contact and extending across at least some of the stacked device layers, a parameter on the sensing contact indicative of whether the conductive path extends continuously between the sensing contact and the source;
    a memory storing first and second sets of integrated circuit identification signals;
    a switch responsive to the sensing contract, coupled with the memory, and operative (1) to select a circuit identification signal from the first set as an output when a sensed signal on the sensing contact is in a first range of values, and (2) to select a circuit identification signal from the second set as the output when the sensed signal on the sensing contact is in a second range of values.

6. The invention of claim 5 wherein the source is characterized by a source value, and wherein the source value is closer to the first range of values than to the second range of values.

7. The invention of claim 5 wherein the source and the sensing contact are disposed on different ones of the stacked device layers.

8. The invention of claim 5 wherein the source comprises a voltage source, wherein the sensed signal comprises a voltage signal, and wherein the first and second ranges of values are respective ranges of voltages.

9. The invention of claim 5 wherein the switch comprises a multiplexer.

* * * * *